(12) United States Patent
Hashimoto et al.

(10) Patent No.: US 11,367,624 B2
(45) Date of Patent: Jun. 21, 2022

(54) MANUFACTURING METHOD OF SEMICONDUCTOR DEVICE

(71) Applicant: KIOXIA CORPORATION, Tokyo (JP)

(72) Inventors: Junichi Hashimoto, Yokkaichi Mie (JP); Kaori Narumiya, Yokkaichi Mie (JP); Kosuke Horibe, Yokkaichi Mie (JP); Soichi Yamazaki, Yokkaichi Mie (JP); Kei Watanabe, Yokkaichi Mie (JP); Yusuke Kondo, Yokkaichi Mie (JP); Mitsuhiro Omura, Nagoya Aichi (JP); Takehiro Kondoh, Yokkaichi Mie (JP); Yuya Matsubara, Yokkaichi Mie (JP); Junya Fujita, Nagoya Aichi (JP); Toshiyuki Sasaki, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/806,622

(22) Filed: Mar. 2, 2020

(65) Prior Publication Data

US 2021/0066090 A1 Mar. 4, 2021

(30) Foreign Application Priority Data

Sep. 2, 2019 (JP) .............................. JP2019-159683

(51) Int. Cl.
*H01L 21/311* (2006.01)
*H01L 21/033* (2006.01)
*H01L 27/11556* (2017.01)
*H01L 27/11582* (2017.01)

(52) U.S. Cl.
CPC .... *H01L 21/31144* (2013.01); *H01L 21/0332* (2013.01); *H01L 21/31122* (2013.01); *H01L 27/11556* (2013.01); *H01L 27/11582* (2013.01)

(58) Field of Classification Search
CPC ................................................. H01L 21/31144
See application file for complete search history.

(56) References Cited

U.S. PATENT DOCUMENTS

| | | |
|---|---|---|
| 2012/0190166 A1 | 7/2012 | Okuda |
| 2013/0052824 A1* | 2/2013 | Hagiwara ............. G03F 7/0046 438/689 |
| 2015/0056811 A1 | 2/2015 | Kondoh et al. |
| 2016/0071957 A1 | 3/2016 | Oshiki et al. |
| 2016/0276166 A1* | 9/2016 | Yamamoto ........ H01L 21/31144 |
| 2017/0069655 A1* | 3/2017 | Ichinose ........... H01L 27/11556 |
| 2017/0092505 A1* | 3/2017 | Nakao .................. H01L 21/3065 |
| 2018/0354804 A1* | 12/2018 | Venkatasubramanian ..... C01B 32/26 |
| 2019/0131140 A1* | 5/2019 | Sun .................... H01L 21/31122 |
| 2020/0006148 A1* | 1/2020 | Chen .................... H01L 21/3086 |

* cited by examiner

*Primary Examiner* — Mounir S Amer
(74) *Attorney, Agent, or Firm* — Foley & Lardner LLP (57) ABSTRACT

According to one embodiment, a method of manufacturing a semiconductor device includes forming a first film on a substrate. The method further includes forming a second film on the first film. The method further includes forming a recess in the first film using the second film as a mask. The second film includes a first layer having carbon and a second layer having carbon formed on the first layer. The second layer has a second carbon density lower than a first carbon density of the first layer.

19 Claims, 7 Drawing Sheets

MANUFACTURING METHOD OF SEMICONDUCTOR DEVICE

CROSS-REFERENCE TO RELATED APPLICATION(S)

This application is based upon and claims the benefit of priority from Japanese Patent Application No. 2019-159683, filed Sep. 2, 2019, the entire contents of which are incorporated herein by reference.

FIELD

Embodiments described herein relate generally to a manufacturing method of a semiconductor device.

BACKGROUND

When recesses such as holes or slits are formed in films on a substrate through etching, if the performance of an etching mask layer provided on the films is poor, in some cases, the recesses may not be suitably formed.

Examples of related art include US-A-2012-0190166.

DETAILED DESCRIPTION

Embodiments provide a manufacturing method of a semiconductor device in which it is possible to suitably form a recess in a film.

In general, according to one embodiment, a method of manufacturing a semiconductor device includes forming a first film on a substrate. The method further includes forming a second film on the first film. The method further includes forming a recess in the first film using the second film as a mask. The second film includes a first layer having carbon and a second layer having carbon formed on the first layer. The second layer has a second carbon density lower than a first carbon density of the first layer.

Hereinafter, embodiments of the present disclosure will be described with reference to drawings. In FIGS. 1 to 7A and 7B, the same components are denoted by the same reference numerals, and redundant descriptions thereof will be omitted.

First Embodiment

Figure 1:
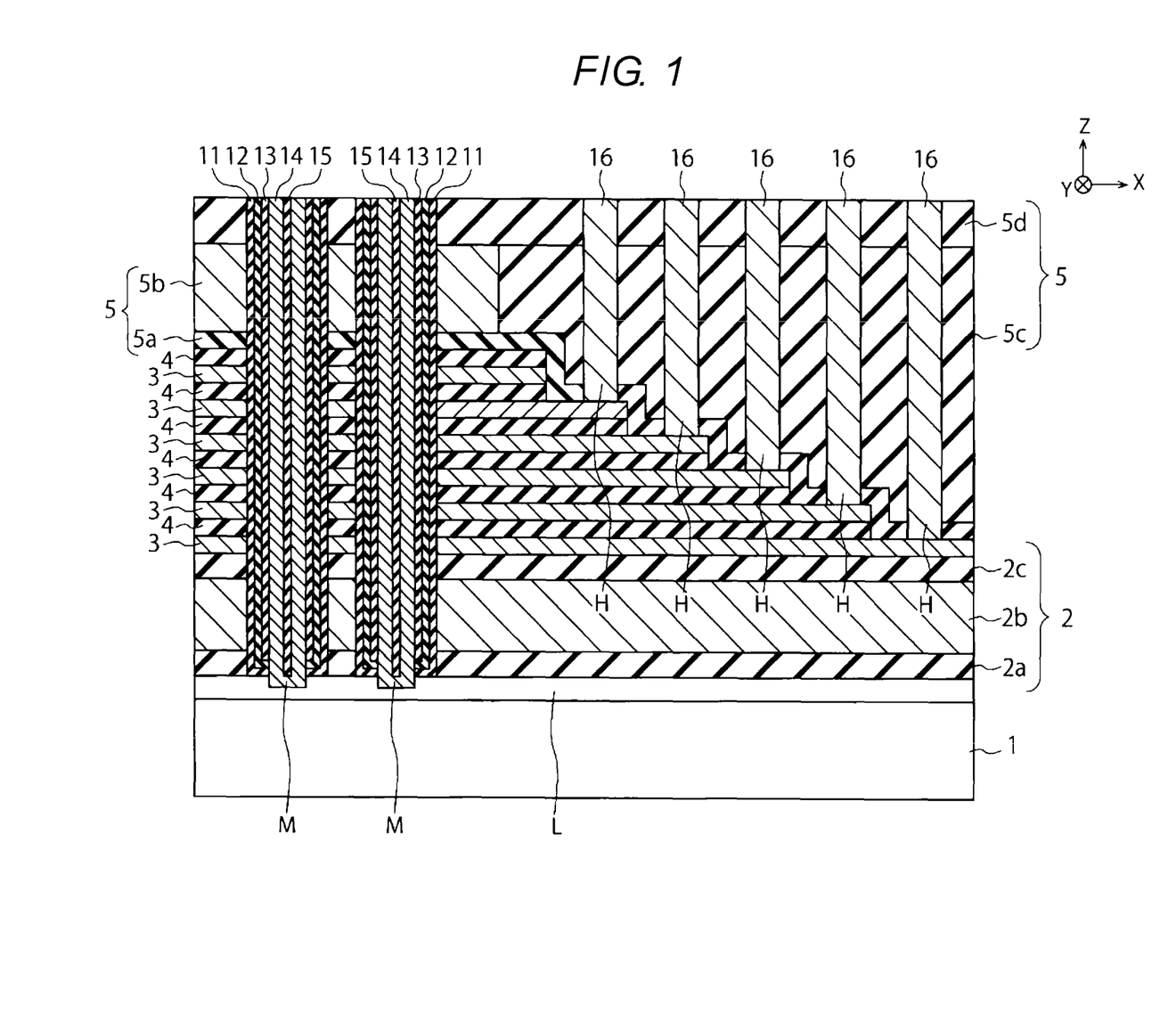
FIG. 1 is a sectional view illustrating a structure of a semiconductor device of a first embodiment.

FIG. 1 is a sectional view illustrating a structure of a semiconductor device of a first embodiment. The semiconductor device of FIG. 1 is a three-dimensional memory.

The semiconductor device of FIG. 1 includes a substrate 1, a lower layer 2, a plurality of electrode layers 3, a plurality of insulating layers 4, an upper layer 5, a plurality of memory holes M, and a plurality of contact holes H. The semiconductor device of FIG. 1 further includes a block insulating film 11, a charge storage layer 12, a tunnel insulating film 13, a channel semiconductor layer 14, and a core insulating film 15 sequentially provided in each memory hole M, and a contact plug 16 provided in each contact hole H.

The substrate 1 is, for example, a semiconductor substrate such as a silicon (Si) substrate. FIG. 1 illustrates the X direction and the Y direction which are parallel to the surface of the substrate 1 and perpendicular to each other, and the Z direction perpendicular to the surface of the substrate 1. In this specification, the +Z direction is treated as an upward direction, and the −Z direction is treated as a downward direction. The −Z direction may or may not be coincident with the gravity direction.

The lower layer 2 is formed on a diffusion layer L formed in the substrate 1, and includes a first lower insulating film 2a, a source-side conductive layer 2b, and a second lower insulating film 2c sequentially formed on the substrate 1. The first lower insulating film 2a is, for example, a silicon oxide film ($SiO_2$). The source-side conductive layer 2b is, for example, a polysilicon layer. The second lower insulating film 2c is, for example, a silicon oxide film.

The plurality of electrode layers 3 and the plurality of insulating layers 4 are alternately stacked on the lower layer 2. The electrode layer 3 is, for example, a metal layer such as a tungsten (W) layer, or a semiconductor layer such as a polysilicon layer, and functions as a word line. The insulating layer 4 is, for example, a silicon oxide film. FIG. 1 illustrates the plurality of memory holes M passing through these stacked films including the electrode layers 3 and the insulating layers 4, and the plurality of contact holes H formed in a stepped area of the stacked films.

The upper layer 5 is formed on the above stacked films, and includes a cover insulating film 5a, a drain-side conductive layer 5b, a first interlayer insulating film 5c, and a second interlayer insulating film 5d. The cover insulating film 5a is formed on the above stacked films. The drain-side conductive layer 5b is formed on the cover insulating film 5a while adjacent to the stepped area. The first interlayer insulating film 5c is formed on the cover insulating film 5a while filling spaces on the stepped area. The second interlayer insulating film 5d is formed on the drain-side conductive layer 5b and the first interlayer insulating film 5c. The cover insulating film 5a is, for example, a silicon oxide film. The drain-side conductive layer 5b is, for example, a polysilicon layer. The first interlayer insulating film 5c is, for example, a silicon oxide film. The second interlayer insulating film 5d is, for example, a silicon oxide film.

The block insulating film 11, the charge storage layer 12, the tunnel insulating film 13, the channel semiconductor layer 14, and the core insulating film 15 are sequentially formed on the side surface of each memory hole M passing through the lower layer 2, the plurality of electrode layers 3, the plurality of insulating layers 4, and the upper layer 5. As a result, a plurality of memory cells is formed in each memory hole M. The block insulating film 11 is, for example, a silicon oxide film. The charge storage layer 12 is, for example, a silicon nitride film (SiN), but may be a semiconductor layer such as a polysilicon layer. The tunnel insulating film 13 is, for example, a silicon oxide film. The channel semiconductor layer 14 is, for example, a semiconductor layer such as a polysilicon layer, and is electrically connected to the diffusion layer L in the substrate 1. The core insulating film 15 is, for example, a silicon oxide film.

In the stepped area, the plurality of contact plugs 16 are formed in the plurality of contact holes H passing through the upper layer 5. These contact plugs 16 are electrically connected to the different electrode layers 3. Each contact plug 16 is formed by, for example, a barrier metal layer such as a titanium (Ti)-containing layer or a Ta (tantalum)-containing layer, and a plug material layer such as a tungsten layer, a copper (Cu) layer or an aluminum (Al) layer.

FIGS. 2A to 2C and FIGS. 3A to 3C are sectional views illustrating a manufacturing method of the semiconductor device according to the first embodiment.

Figure 2A:
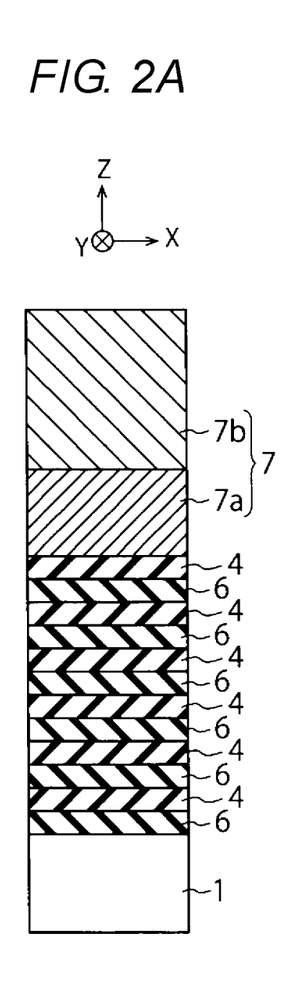
FIGS. 2A to 2C are sectional views (1/2) illustrating a manufacturing method of the semiconductor device according to the first embodiment.

First, the lower layer 2 (not illustrated) is formed on the substrate 1, and a plurality of sacrifice layers 6 and the plurality of insulating layers 4 are alternately stacked on the substrate 1 via the lower layer 2 (FIG. 2A). The sacrifice layer 6 is, for example, a silicon nitride film. Then, the upper layer 5 (not illustrated) is formed on these stacked films including the sacrifice layers 6 and the insulating layers 4, and a mask layer 7 is formed on these stacked films via the upper layer 5 (FIG. 2A). The mask layer 7 is, for example, a carbon (C) film. For the lower layer 2 and the upper layer 5, refer to FIG. 1. The lower layer 2, the plurality of sacrifice layers 6, the plurality of insulating layers 4, and the upper layer 5 are an example of a first film, and the mask layer 7 is an example of a second film. The sacrifice layer 6 is an example of a first insulating layer in the first film, and the insulating layer 4 is an example of a second insulating layer in the first film.

In the step of FIG. 2A, instead of the plurality of sacrifice layers 6 and the plurality of insulating layers 4, the plurality of electrode layers 3 and the plurality of insulating layers 4 may be alternately stacked on the substrate 1. In this case, a step of replacing the sacrifice layers 6 with the electrode layers 3 (to be described below) may not be performed. In this case, the lower layer 2, the plurality of electrode layers 3, the plurality of insulating layers 4, and the upper layer 5 are an example of the first film, and the mask layer 7 is an example of the second film.

In the present embodiment, etching is performed on the lower layer 2, the plurality of sacrifice layers 6, the plurality of insulating layers 4, and the upper layer 5, as an etching target film, by using the mask layer 7 as an etching mask layer. Hereinafter, details of the mask layer 7 of the present embodiment will be described.

The mask layer 7 includes a mask layer 7a formed on the above stacked films, and a mask layer 7b formed on the mask layer 7a. Both the mask layer 7a and the mask layer 7b of the present embodiment are carbon films, but have different properties. The mask layer 7a is an example of a first layer in the second film, and the mask layer 7b is an example of a second layer in the second film.

In the present embodiment, the mask layer 7a has a high density, and the mask layer 7b has a low density. As a result, the density of the mask layer 7b is lower than the density of the mask layer 7a. The density of the mask layer 7a is, for example, 2.0 g/cm$^3$ or more. In some embodiments, the density of the mask layer 7a is 2.3 g/cm$^3$ or more. The density of the mask layer 7b is, for example, less than 2.0 g/cm$^3$. In some embodiments, the density of the mask layer 7b is 1.9 or more and less than 2.0 g/cm$^3$.

The mask layer 7a is, for example, a diamond-like carbon film, and the mask layer 7b is, for example, an amorphous carbon film. Each of the mask layer 7a and the mask layer 7b may be a pure carbon film, or may be a film containing carbon atoms and other atoms, for example, a carbon film containing carbon atoms as a main component and other impurity atoms. The mask layer 7a and the mask layer 7b of the present embodiment are carbon films containing or not containing atoms other than carbon, and the carbon concentration in the mask layer 7b is lower than the carbon concentration in the mask layer 7a. Here, the carbon concentration is the number of carbon atoms per unit volume.

The mask layer 7a is, for example, a diamond-like carbon film containing carbon atoms at a composition ratio of 90% or more, and hydrogen atoms at a composition ratio of 10% or less. The mask layer 7a may further contain impurity atoms such as a tungsten atom, a boron atom, a nitrogen atom, or an oxygen atom. The mask layer 7a of the present embodiment includes a large amount of diamond SP3 structures. This may be analyzed by, for example, Raman spectroscopy. When analyzed by the Raman spectroscopy, the mask layer 7a has a D and G band ratio (ID/IG ratio) of 1 or less. The film thickness of the mask layer 7a is, for example, 200 nm or more.

Here, the Raman spectroscopy and the ID/IG ratio will be additionally described. For example, when a Raman spectroscopy spectrum is fit with a Gaussian function or the like and peaks are separated, in general, a peak at a wave number near 1350 cm$^{-1}$ is called a D band peak, and a peak at a wave number near 1550 cm$^{-1}$ is called a G band peak. The intensity ratio of these peaks becomes the ID/IG ratio. The mask layer 7b is, for example, a carbon film containing carbon atoms having a composition ratio of 90% or less and hydrogen atoms having a composition ratio of 10% or more. The mask layer 7b may further contain impurity atoms such as a tungsten atom, a boron atom, a nitrogen atom, and an oxygen atom. The hydrogen atom contained in the mask layer 7b may be free hydrogen having no bond with any atom. In this case, the number of free hydrogen in the mask layer 7b is preferably, for example, $1.5 \times 10^{22}$ atoms/cm$^3$ or more. The mask layer 7b may have a two-layer structure, and the upper layer may contain $1.5 \times 10^{22}$ atoms/cm$^3$ or more of free hydrogen. The presence of free hydrogen in the mask layer 7b can be confirmed using, for example, FT-IR (Fourier transform infrared spectrophotometer) and RBS (Rutherford backscattering spectroscopy) or HFS (hydrogen forward scattering analysis). By including a large amount of free hydrogen in the mask layer 7b, the etching rate of the mask layer 7b can be increased in the later-described etching step of the film to be etched, as compared with the case where the mask layer 7b does not include free hydrogen.

It is possible to form the mask layer 7a and the mask layer 7b by, for example, one of the following methods. In a first method, both the mask layer 7a and the mask layer 7b are formed by chemical vapor deposition (CVD). In a second method, both the mask layer 7a and the mask layer 7b are formed by physical vapor deposition (PVD). In a third method, the mask layer 7a and the mask layer 7b are formed by PVD and CVD, respectively. In a fourth method, the mask layer 7a and the mask layer 7b are formed by a vacuum gas phase process (for example, CVD or PVD) and an atmospheric pressure liquid phase process, respectively. In the present embodiment, any one of the first to fourth methods may be employed.

Examples of the above CVD may include plasma CVD, thermal CVD, and photo CVD. Meanwhile, examples of the above PVD may include a sputtering method, an arc ion plating method, an ion deposition method, an ion beam method, and a laser ablation method. In general, the density of a film formed by PVD is higher than the density of a film formed by CVD, and thus the film formed by the PVD is harder than the film formed by the CVD. Thus, in the third method, the mask layer 7a is formed by the PVD, and the mask layer 7b is formed by the CVD. Meanwhile, it is possible to adjust the density of a film only by changing CVD conditions or PVD conditions. Therefore, in the first method, both the mask layer 7a and the mask layer 7b are formed by the CVD, and in the second method, both the mask layer 7a and the mask layer 7b are formed by the PVD. In this case, since the mask layer 7a and the mask layer 7b may be formed by the same method, it is possible to simplify steps of forming the mask layer 7a and the mask layer 7b.

When a carbon film is formed by CVD, for example, a $C_XH_Y$ gas is used as a source gas (C represents carbon, H represents hydrogen, and each of X and Y represents an integer of 1 or more). In this case, the carbon film may contain hydrogen atoms as impurity atoms. Meanwhile, even when a carbon film is formed by PVD, in many cases, the carbon film contains hydrogen atoms as impurity atoms. Therefore, the mask layer 7a or the mask layer 7b in the present embodiment, which is formed by CVD or PVD, may contain hydrogen atoms as impurity atoms. Further, the mask layer 7b containing a large amount of free hydrogen can be formed by controlling the pressure at the time of forming the carbon film, without being limited to CVD or PVD.

Hereinafter, various steps subsequent to the step of FIG. 2A will be described.

Figure 2B:
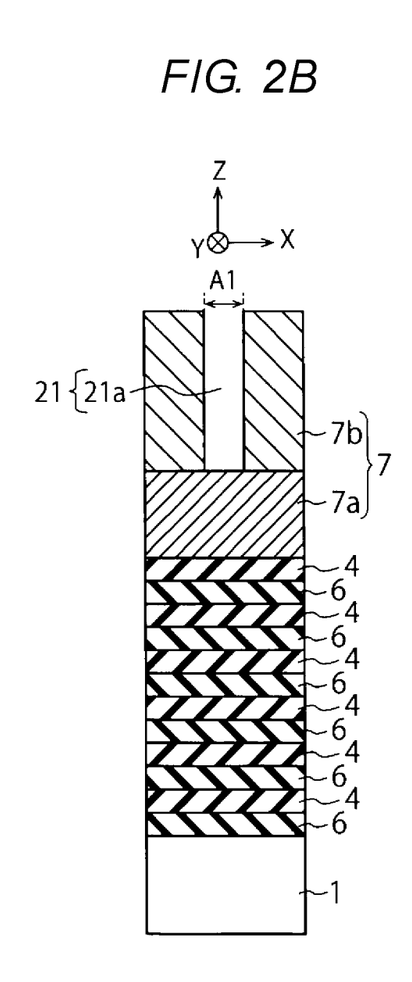

Next, a recess 21 is formed in the mask layer 7b by dry etching (FIG. 2B). In the present embodiment, a hard mask layer and a resist film (not illustrated) are formed on the mask layer 7b, the resist film is patterned by lithography, and the hard mask layer is processed by dry etching using the resist film as a mask. Then, the mask layer 7b is processed by dry etching using the hard mask layer as a mask so as to form the recess 21 in the mask layer 7b.

The recess 21 of the present embodiment is a hole for forming the memory hole M in FIG. 1, and has substantially a cylindrical shape. The recess 21 in FIG. 2B includes a recess 21a formed in the mask layer 7b. The reference numeral A1 indicates the diameter of the recess 21a formed in the mask layer 7b.

Figure 2C:
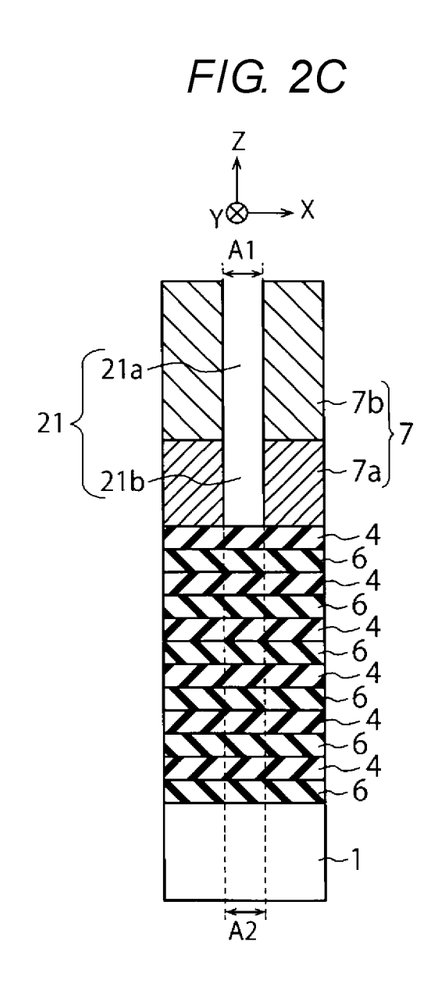

Next, the mask layer 7a in the recess 21 is processed by dry etching, and the recess 21 is transferred to the mask layer 7a (FIG. 2C). As a result, the bottom surface of the recess 21 is lowered from the height of the lower surface of the mask layer 7b to the height of the lower surface of the mask layer 7a. The recess 21 in FIG. 2C includes the recess 21a formed in the mask layer 7b, and the recess 21b formed in the mask layer 7a. The reference numeral A2 indicates the diameter of the recess 21b formed in the mask layer 7a. In FIG. 2C, the diameter A2 of the recess 21b is substantially the same as the diameter A1 of the recess 21a.

Figure 3A:
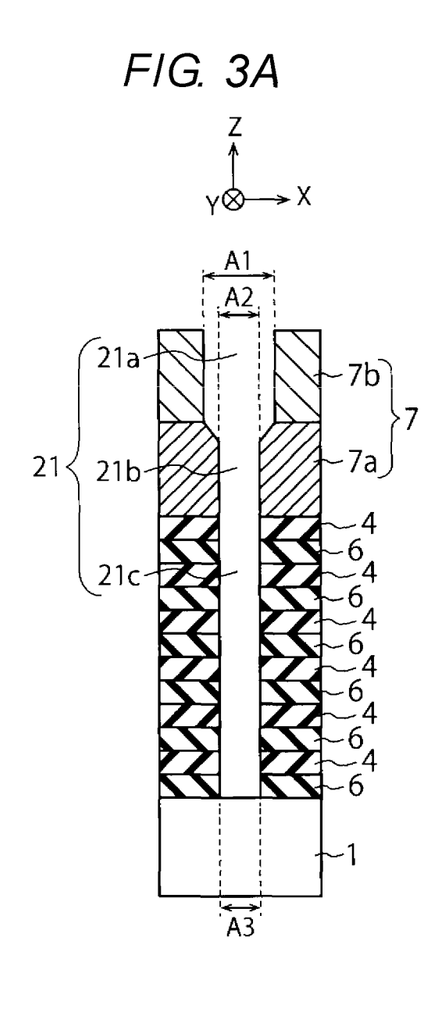
FIGS. 3A to 3C are sectional views (2/2) illustrating the manufacturing method of the semiconductor device according to the first embodiment.

Next, etching is performed on the lower layer 2, the plurality of sacrifice layers 6, the plurality of insulating layers 4, and the upper layer 5, as an etching target film, by using the mask layer 7a and the mask layer 7b as etching mask layers (FIG. 3A). Specifically, the etching target film in the recess 21 is processed by dry etching, and the recess 21 is transferred to the etching target film. As a result, the bottom surface of the recess 21 is lowered from the height of the lower surface of the mask layer 7a to the height of the upper surface of the substrate 1. The recess 21 in FIG. 3A includes the above described recesses 21a and 21b, and a recess 21c formed in the etching target film. The reference numeral A3 indicates the diameter of the recess 21c formed in the etching target film. In FIG. 3A, the diameter A3 of the recess 21c is substantially the same as the diameter A2 of the recess 21b. The recess 21c corresponds to the above described memory hole M.

As described above, the density of the mask layer 7b of the present embodiment is set to be low. Thus, the mask layer 7b is easily removed by dry etching. Since the etching target film of the present embodiment has a large film thickness, a time required for the step of FIG. 3A becomes long, and the mask layer 7b is likely to be largely removed in the step of FIG. 3A. Therefore, the diameter A1 of the recess 21a in FIG. 3A is wider than the diameter A1 of the recess 21a in FIG. 2B or FIG. 2C.

The above described widening of the diameter A1 of the recess 21a has an advantage in that blocking of the recess 21 may be prevented during execution of the step of FIG. 3A. Meanwhile, when the diameter A1 of the recess 21a is widened in this manner, there is a risk that the diameter of the memory hole M, that is, the diameter A3 of the recess 21c, may excessively increase.

Therefore, the mask layer 7 of the present embodiment is formed by the mask layer 7a and the mask layer 7b, and the density of the mask layer 7a is set to be high. Accordingly, even when the diameter A1 of the recess 21a is widened, the diameter A2 of the recess 21b may be prevented from being widened, and the diameter of the memory hole M may be prevented from excessively increasing. In this manner, according to the present embodiment, it is possible to prevent blocking of the recess 21 while preventing enlargement of the diameter of the memory hole M.

Figure 3B:
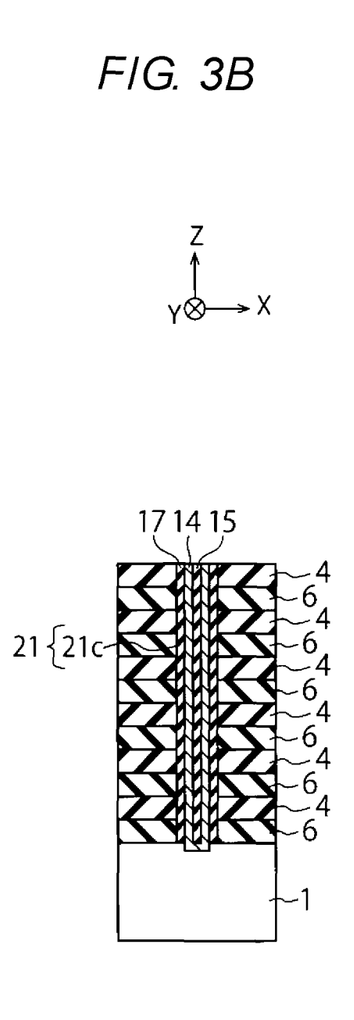

Next, after the mask layer 7a and the mask layer 7b are removed, a memory insulating film 17, the channel semiconductor layer 14, and the core insulating film 15 are sequentially formed on the side surface and the bottom surface of the recess 21c (the memory hole M) (FIG. 3B). The memory insulating film 17 includes the block insulating film 11, the charge storage layer 12, and the tunnel insulating film 13 in FIG. 1, in this order.

For example, the memory insulating film 17, the channel semiconductor layer 14, and the core insulating film 15 are formed as follows. First, the memory insulating film 17 is formed on the side surface and the bottom surface of the recess 21c, and the memory insulating film 17 is removed from the bottom portion of the memory hole M. As a result, the substrate 1 is exposed at the bottom portion of the memory hole M. Then, the channel semiconductor layer 14 and the core insulating film 15 are sequentially formed on the tunnel insulating film 13 of the recess 21c or the surface of the substrate 1. As a result, the channel semiconductor layer 14 is electrically connected to the substrate 1.

Figure 3C:
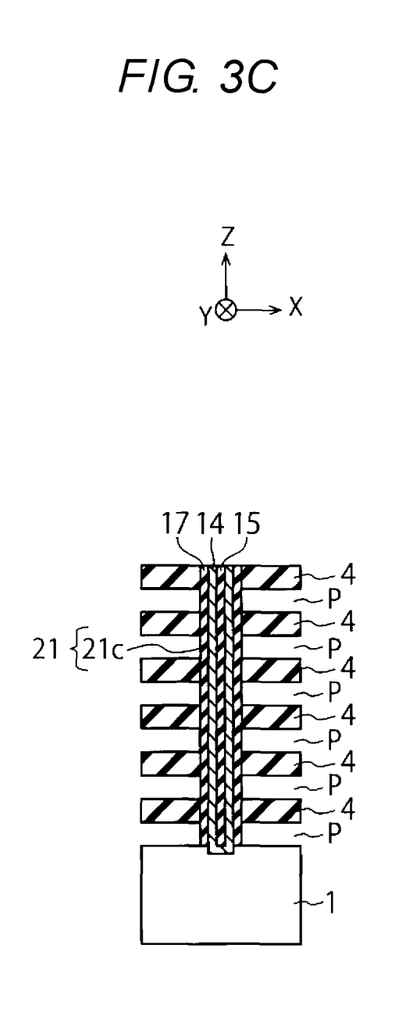

Then, the sacrifice layers 6 are removed by a chemical liquid such as a phosphoric acid aqueous solution (FIG. 3C). As a result, a plurality of cavities P is formed between the insulating layers 4. Then, the electrode layers 3 are embedded in these cavities P. As a result, as illustrated in FIG. 1, stacked films including the plurality of electrode layers 3 and the plurality of insulating layers 4 are formed on the lower layer 2. Here, the electrode layer 3 may be formed in the cavity P after an insulating film constituting a part of the block insulating film 11 is formed in the cavity P.

Next, various wiring layers, plug layers, interlayer insulating films and the like are formed on the substrate 1. In this manner, the semiconductor device of FIG. 1 is manufactured.

Figure 4A:
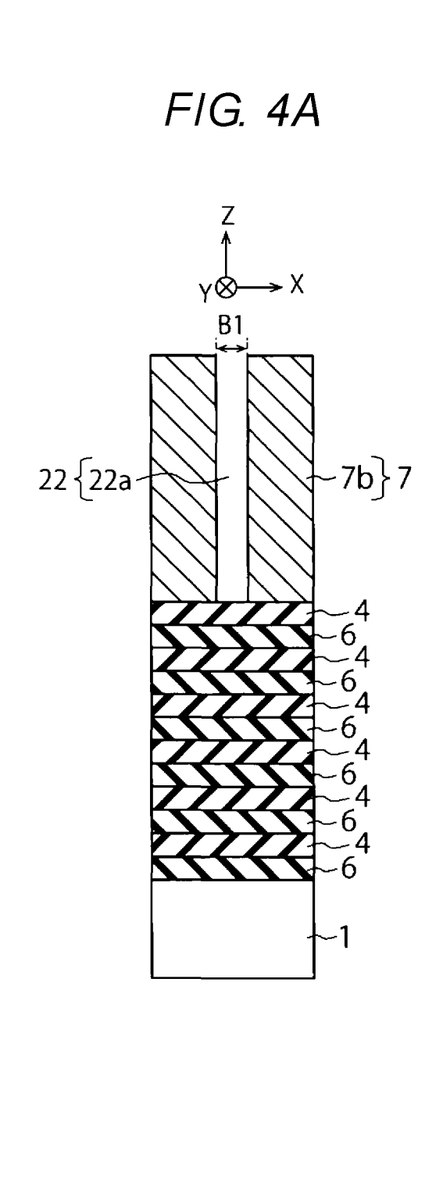
FIGS. 4A to 4C are sectional views illustrating a manufacturing method of a semiconductor device according to a comparative example of the first embodiment.
Figure 4B:
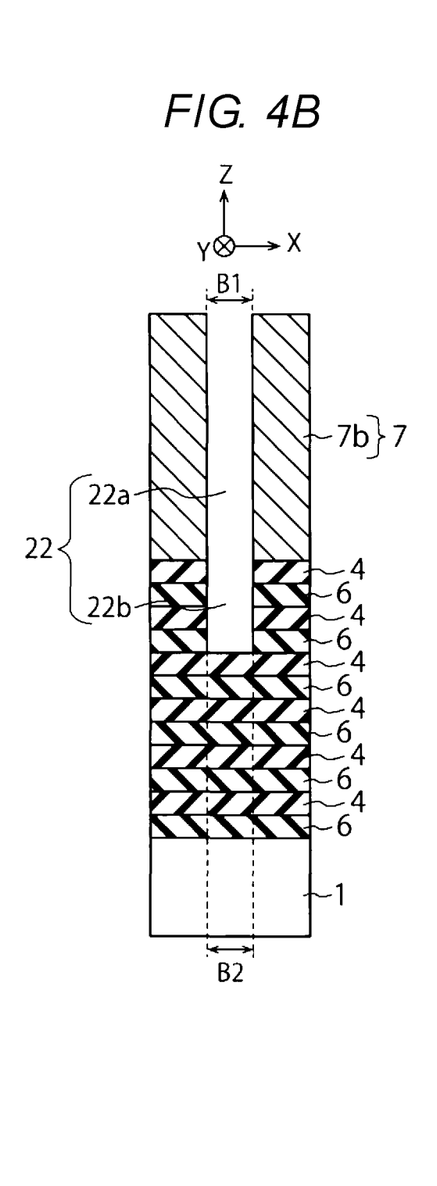
Figure 4C:
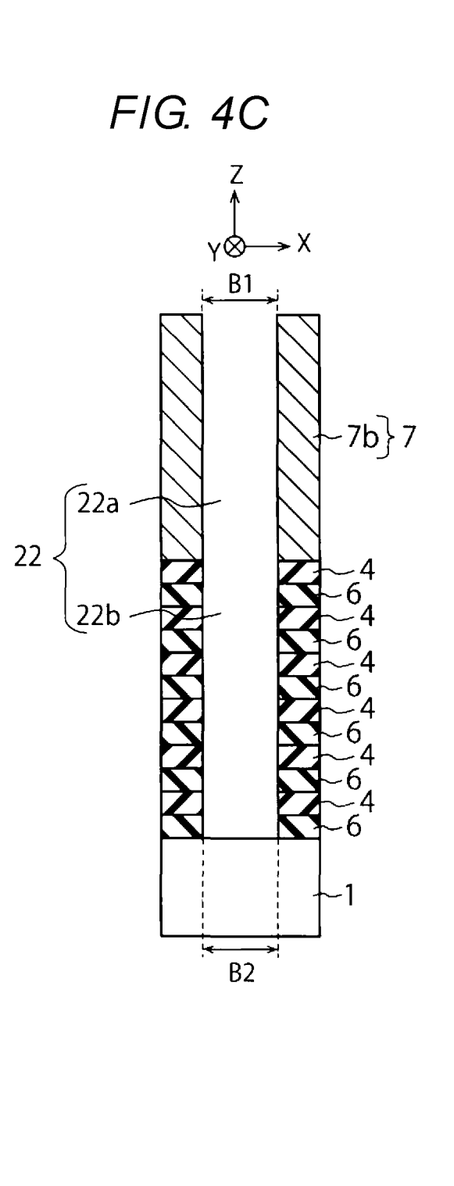

FIGS. 4A to 4C are sectional views illustrating a manufacturing method of a semiconductor device according to a comparative example of the first embodiment.

As illustrated in FIG. 4A, the mask layer 7 of this comparative example is formed only by the mask layer 7b having a low density. FIG. 4A illustrates a recess 22 including a recess 22a formed in the mask layer 7b, and the diameter B1 of the recess 22a.

FIG. 4B illustrates an etching target film to which the recess 22 is being transferred, and FIG. 4C illustrates the etching target film to which the recess 22 is already transferred. FIG. 4B and FIG. 4C illustrate the recess 22 including the recess 22a of the mask layer 7b and a recess 22b of the etching target film, and the diameter B2 of the recess 22b.

The mask layer 7 of this comparative example is formed only by the mask layer 7b having a low density, and thus is easily removed during dry etching of the etching target film. For this reason, as illustrated in FIG. 4B and FIG. 4C, the diameter B1 of the recess 22a is gradually widened. As a result, the diameter B2 of the recess 22b, that is, the diameter of the memory hole M, is also gradually widened.

As described above, the mask layer 7 of the present embodiment is formed by the mask layer 7a and the mask layer 7b, and the density of the mask layer 7b is set to be lower than the density of the mask layer 7a. Therefore, according to the present embodiment, it is possible to prevent enlargement of the diameter of the memory hole M or blocking of the recess 21, and thus, it is possible to suitably form the memory hole M (the recess 21) in the etching target film.

The mask layer 7 of the present embodiment is used for etching of an etching target film including a plurality of types of layers (the lower layer 2, the plurality of sacrifice layers 6, the plurality of insulating layers 4, and the upper layer 5), but may be used for etching of an etching target film including a single layer. Examples of such an etching target film may include a silicon oxide film, a silicon nitride film, a semiconductor layer, and a metal layer. The same also applies to a second embodiment to be described below.

Second Embodiment

FIGS. 5A to 5c and FIGS. 6A to 6C are sectional views illustrating a manufacturing method of a semiconductor device according to a second embodiment. In the present embodiment, the semiconductor device of FIG. 1 is manufactured by a method different from that of the first embodiment.

Figure 5A:
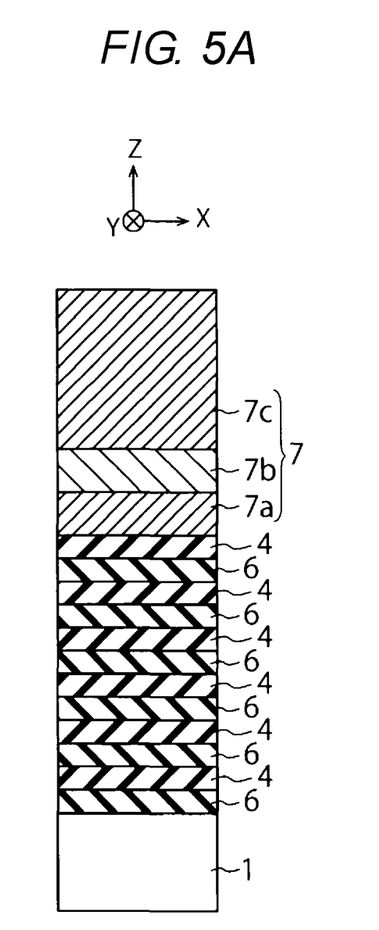
FIGS. 5A to 5C are sectional views (1/2) illustrating a manufacturing method of a semiconductor device according to a second embodiment.

First, the lower layer 2 (not illustrated) is formed on the substrate 1, and the plurality of sacrifice layers 6 and the plurality of insulating layers 4 are alternately stacked on the substrate 1 via the lower layer 2 (FIG. 5A). Then, the upper layer 5 (not illustrated) is formed on these stacked films including the sacrifice layers 6 and the insulating layers 4, and the mask layer 7 is formed on these stacked films via the upper layer 5 (FIG. 5A).

The mask layer 7 includes the mask layer 7a formed on the above stacked films, the mask layer 7b formed on the mask layer 7a, and a mask layer 7c formed on the mask layer 7b. All of the mask layer 7a, the mask layer 7b, and the mask layer 7c of the present embodiment are carbon films. The mask layer 7a is an example of the first layer in the second film, the mask layer 7b is an example of the second layer in the second film, and the mask layer 7c is an example of a third layer in the second film.

The properties of the mask layer 7a and the mask layer 7b of the present embodiment are the same as the properties of the mask layer 7a and the mask layer 7b of the first embodiment, respectively. The properties of the mask layer 7c of the present embodiment are the same as the properties of the mask layer 7a of the first embodiment. Therefore, in the present embodiment, the mask layer 7a has a high density, the mask layer 7b has a low density, and the mask layer 7c has a high density. As a result, the density of the mask layer 7b is lower than the density of the mask layer 7a, and the density of the mask layer 7c is higher than the density of the mask layer 7b. Like the density of the mask layer 7a, the density of the mask layer 7c is, for example, 2.0 g/cm$^3$ or more, and preferably 2.3 g/cm$^3$ or more. Other properties of the mask layer 7c are also the same as those of the mask layer 7a.

For example, the mask layer 7c of the present embodiment is a diamond-like carbon film, and the carbon concentration in the mask layer 7c is higher than the carbon concentration in the mask layer 7b. The mask layer 7c of the present embodiment may be a diamond-like carbon film containing carbon atoms at a composition ratio of 90% or more, and hydrogen atoms at a composition ratio of 10% or less. Meanwhile, the total film thickness of the mask layer 7a and the mask layer 7b of the present embodiment is set to be thinner than the total film thickness of the mask layer 7a and the mask layer 7b of the first embodiment.

Figure 5B:
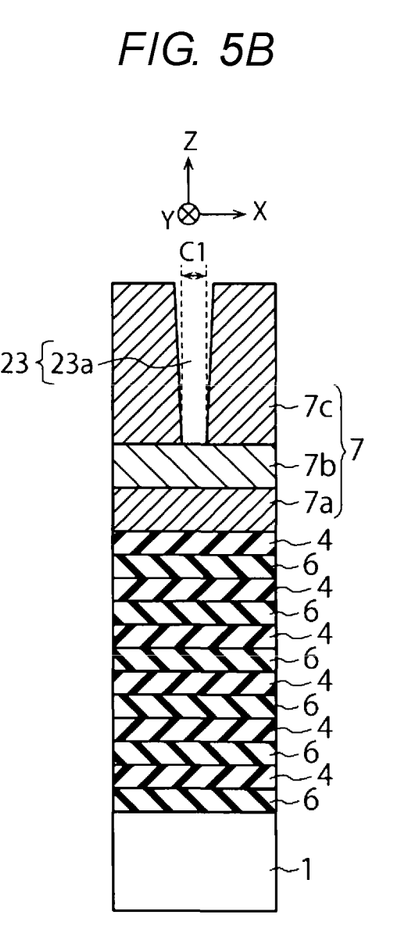

Next, a recess 23 is formed in the mask layer 7c by dry etching (FIG. 5B). In the present embodiment, a hard mask layer and a resist film (not illustrated) are formed on the mask layer 7c, the resist film is patterned by lithography, and the hard mask layer is processed by dry etching using the resist film as a mask. Then, the mask layer 7c is processed by dry etching using the hard mask layer as a mask so as to form the recess 23 in the mask layer 7c. An example of dry etching is reactive ion etching (RIE) (hereinafter, the same is applied).

Like the recess 21 of the first embodiment, the recess 23 of the present embodiment is a hole for forming the memory hole M in FIG. 1, and has substantially a cylindrical shape. The recess 23 in FIG. 5B includes a recess 23a formed in the mask layer 7c, and the recess 23a is formed to have a tapered shape. The reference numeral C1 indicates the diameter of the bottom surface of the recess 23a formed in the mask layer 7c.

Figure 5C:
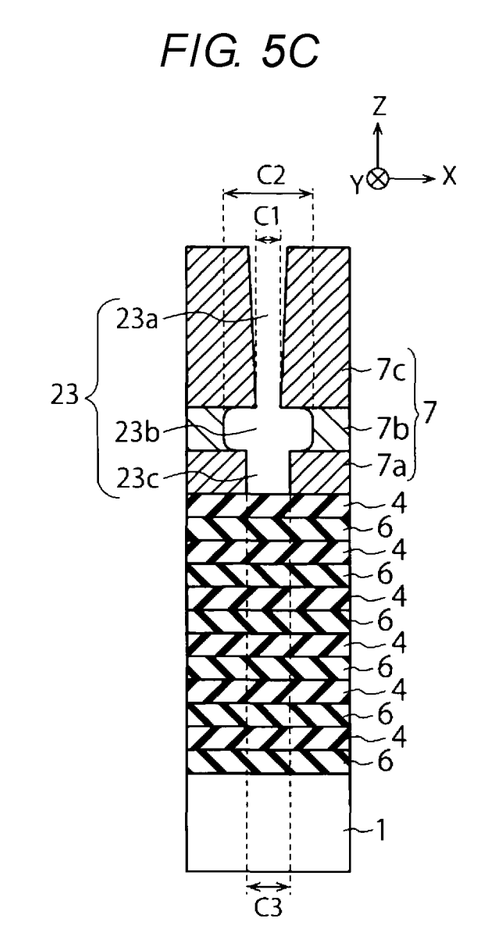

Next, the mask layer 7b and the mask layer 7a in the recess are processed by dry etching, and the recess 23 is transferred to the mask layer 7b and the mask layer 7a (FIG. 5C). As a result, the bottom surface of the recess 23 is lowered from the height of the lower surface of the mask layer 7c, to the height of the lower surface of the mask layer 7a. The recess 23 of FIG. 5C includes the recess 23a formed in the mask layer 7c, a recess 23b formed in the mask layer 7b, and a recess 23c formed in the mask layer 7a. The reference numeral C2 indicates the diameter of the recess 23b formed in the mask layer 7b. The reference numeral C3 indicates the diameter of the recess 23c formed in the mask layer 7a.

When an etching target film is processed by using the mask layer 7 having the taper-shaped recess 23, ions recoiling from the side surface of the recess 23 of the mask layer 7 adversely affect the shape of the etching target film. Then, bowing occurs in the etching target film (details of the bowing will be described below with reference to FIG. 7B). It is desirable to prevent such occurrence of the bowing.

Therefore, the mask layer 7 of the present embodiment includes the mask layer 7b under the mask layer 7c. Since the density of the mask layer 7b is set to be low, the mask layer 7b is easily removed by dry etching. Therefore, the mask layer 7b is also easily etched during transfer of the recess 23 to the mask layer 7a under the mask layer 7b. Thus, the diameter C2 of the recess 23b in FIG. 5C is wider than the diameter C1 of the bottom surface of the recess 23a.

As described above, when the diameter C2 of the recess 23b is widened, the recess 23b may accommodate recoiling ions, and thus it is possible to prevent occurrence of bowing in the etching target film (the prevention of occurrence of the bowing will be described below with reference to FIG. 6A). Meanwhile, when the diameter C2 of the recess 23b is widened in this manner, there is a risk that the diameter of the memory hole M may excessively increase.

Therefore, the mask layer 7 of the present embodiment includes the mask layer 7a under the mask layer 7b. Since the density of the mask layer 7a is set to be high, even when the diameter C2 of the recess 23b is widened, the diameter C3 of the recess 23c may be prevented from being widened, and the diameter of the memory hole M may be prevented from excessively increasing. In this manner, according to the present embodiment, it is possible to prevent occurrence of bowing in the etching target film while preventing enlargement of the diameter of the memory hole M.

Figure 6A:
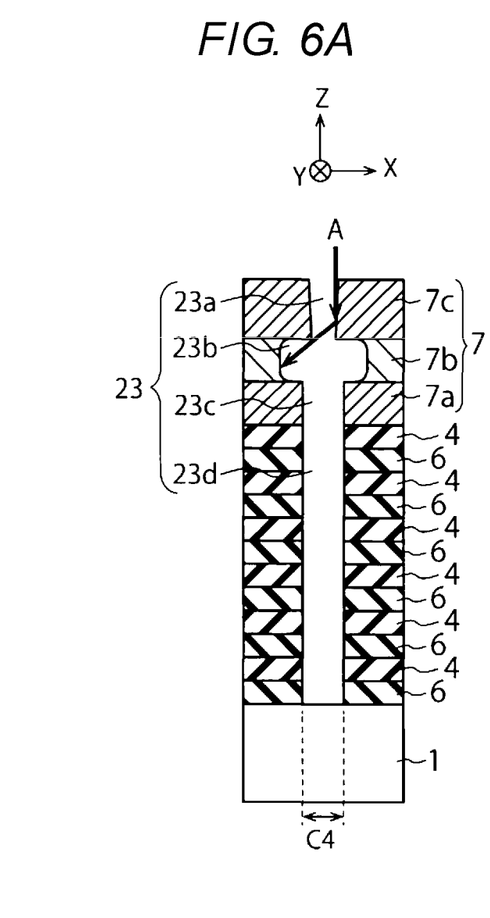
FIGS. 6A to 6C are sectional views (2/2) illustrating the manufacturing method of the semiconductor device according to the second embodiment.

Next, etching is performed on the lower layer 2, the plurality of sacrifice layers 6, the plurality of insulating layers 4, and the upper layer 5, as an etching target film, by using the mask layer 7a, the mask layer 7b, and the mask layer 7c, as etching mask layers (FIG. 6A). Specifically, the etching target film in the recess 23 is processed by dry etching, and the recess 23 is transferred to the etching target film. As a result, the bottom surface of the recess 23 is lowered from the height of the lower surface of the mask layer 7a to the height of the upper surface of the substrate 1. The recess 23 in FIG. 6A includes the above described recesses 23a, 23b, and 23c, and a recess 23d formed in the etching target film. The reference numeral C4 indicates the diameter of the recess 23d formed in the etching target film. In FIG. 6A, the diameter C4 of the recess 23d is substantially the same as the diameter C3 of the recess 23c. The recess 23d corresponds to the above described memory hole M.

The reference numeral A illustrated in FIG. 6A indicates the trajectory of ions that recoil from the side surface of the recess 23a of the mask layer 7c. In the present embodiment, since the recess 23b of the mask layer 7b accommodates recoiling ions, it is possible to prevent occurrence of bowing in the etching target film.

Figure 6B:
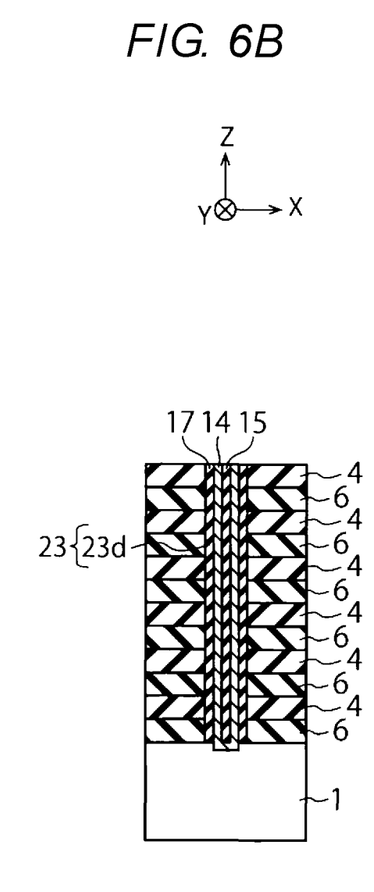

Next, after the mask layer 7a, the mask layer 7b, and the mask layer 7c are removed, the memory insulating film 17, the channel semiconductor layer 14, and the core insulating film 15 are sequentially formed on the side surface and the bottom surface of the recess 23d (the memory hole M) (FIG. 6B). The memory insulating film 17 includes the block insulating film 11, the charge storage layer 12, and the tunnel insulating film 13 in FIG. 1, in this order.

For example, the memory insulating film 17, the channel semiconductor layer 14, and the core insulating film 15 are formed as follows. First, the memory insulating film 17 is formed on the side surface and the bottom surface of the recess 23d, and the memory insulating film 17 is removed from the bottom portion of the memory hole M. As a result, the substrate 1 is exposed at the bottom portion of the memory hole M. Then, the channel semiconductor layer 14 and the core insulating film 15 are sequentially formed on the tunnel insulating film 13 of the recess 23d or the surface of the substrate 1. As a result, the channel semiconductor layer 14 is electrically connected to the substrate 1.

Figure 6C:
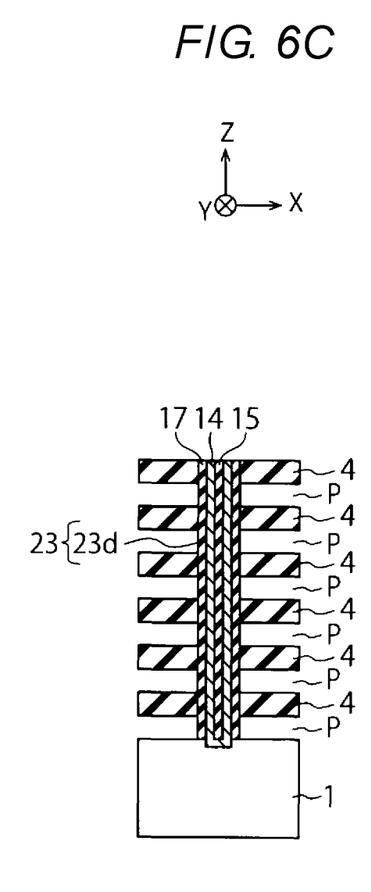

Then, the sacrifice layers 6 are removed by a chemical liquid such as a phosphoric acid aqueous solution (FIG. 6C). As a result, a plurality of cavities P is formed between the insulating layers 4. Then, the electrode layers 3 are embedded in these cavities P. As a result, as illustrated in FIG. 1, stacked films including the plurality of electrode layers 3 and the plurality of insulating layers 4 are formed on the lower layer 2. Here, the electrode layer 3 may be formed in the cavity P after an insulating film constituting a part of the block insulating film 11 is formed in the cavity P.

Next, various wiring layers, plug layers, interlayer insulating films and the like are formed on the substrate 1. In this manner, the semiconductor device of FIG. 1 is manufactured.

Figure 7A:
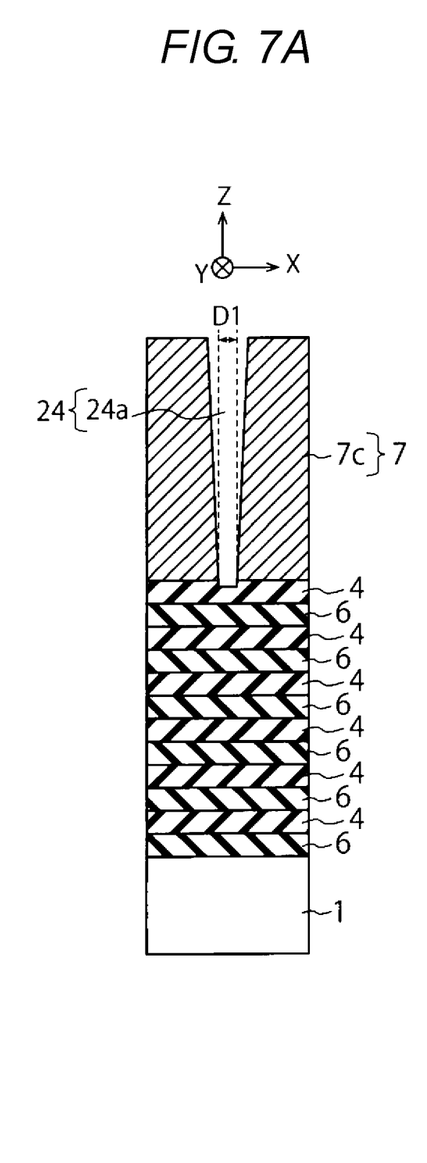
FIGS. 7A and 7B are sectional views illustrating a manufacturing method of a semiconductor device according to a comparative example of the second embodiment.
Figure 7B:
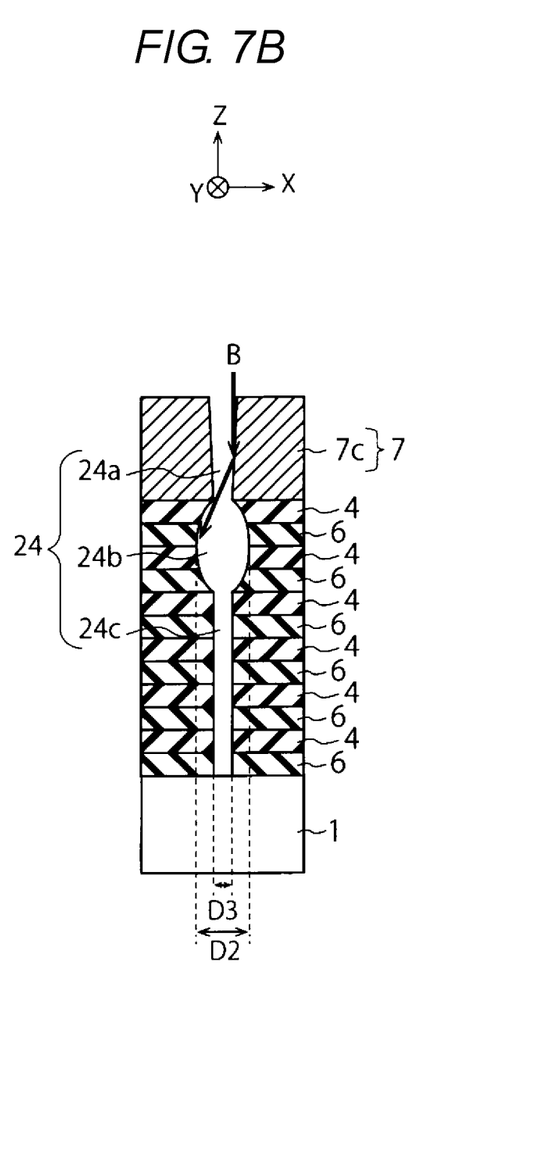

FIGS. 7A and 7B are sectional views illustrating a manufacturing method of a semiconductor device according to a comparative example of the second embodiment.

As illustrated in FIG. 7A, the mask layer 7 of this comparative example is formed only by the mask layer 7c having a high density. FIG. 7A illustrates a recess 24 including a recess 24a formed in the mask layer 7c, and the diameter D1 of the bottom surface of the recess 24a. The recess 24a is formed to have a tapered shape.

FIG. 7B illustrates an etching target film to which the recess 24 is already transferred. FIG. 7B illustrates the recess 24 including the recess 24a of the mask layer 7c and a large recess 24b and a small recess 24c of the etching target film, and the maximum diameter D2 of the large recess 24b and the diameter D3 of the small recess 24c.

The reference numeral B illustrated in FIG. 7B indicates the trajectory of ions that recoil from the side surface of the recess 24a of the mask layer 7. According to an experiment, when the etching target film is processed by using the mask layer 7 having the taper-shaped recess 24a, ions recoiling from the side surface of the recess 24a of the mask layer 7 adversely affect the shape of the etching target film. Then, bowing occurs in the etching target film as in the large recess 24b. Such occurrence of the large recess 24b is not desirable.

Meanwhile, according to the present embodiment, it is possible to prevent occurrence of bowing as in this comparative example while preventing enlargement of the diameter of the memory hole. That is, according to the present embodiment, it is possible to prevent an increase in a variation of the diameter in the memory hole from the upper end to the lower end of the memory hole.

As described above, the mask layer 7 of the present embodiment is formed by the mask layer 7a, the mask layer 7b, and the mask layer 7c. The density of the mask layer 7b is set to be lower than the density of the mask layer 7a, and the density of the mask layer 7c is set to be higher than the density of the mask layer 7b. Therefore, according to the present embodiment, it is possible to prevent enlargement of the diameter of the memory hole M or occurrence of bowing, and thus, it is possible to suitably form the memory hole M (the recess 23) in the etching target film.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a semiconductor device, the method comprising:
   forming a first film on a substrate;
   forming a first layer on the first film;
   forming a second layer on the first layer;
   forming a first recess in the first layer and the second layer; and
   forming a second recess in the first film using the first layer and the second layer that collectively have the first recess as a mask,
   wherein the second layer has a second carbon density lower than a first carbon density of the first layer.

2. The method according to claim 1, wherein the first carbon density of the first layer is 2.0 g/cm$^3$ or more.

3. The method according to claim 1, wherein the second carbon density of the second layer is less than 2.0 g/cm$^3$.

4. The method according to claim 1, wherein a carbon concentration in the second layer is lower than a carbon concentration in the first layer.

5. The method according to claim 1, wherein the first layer is formed by physical vapor deposition (PVD).

6. The method according to claim 1, wherein the first film includes a plurality of first insulating layers and a plurality of second insulating layers, the first insulating layers and second insulating layers alternately stacked on top of one another.

7. The method according to claim 1, further comprising forming a third layer on the second layer, the third layer having carbon with a third carbon density higher than the second carbon density.

8. The method according to claim 7, wherein the third carbon density is 2.0 g/cm$^3$ or more.

9. The method according to claim 7, wherein a carbon concentration in the third layer is higher than a carbon concentration in the second layer.

10. The method according to claim 1, wherein the first film includes a plurality of electrode layers and a plurality of insulating layers, the electrode layers and the insulating layers alternately stacked on top of one another.

11. The method according to claim 1, further comprising forming the recess in the first film using dry etching.

12. The method according to claim 1, wherein the first carbon density of the first layer is 2.3 g/cm$^3$ or more.

13. The method according to claim 1, wherein the second carbon density of the second layer is 1.9 g/cm$^3$ or more and 2.0 g/cm$^3$ or less.

14. The method according to claim 1, wherein the first film includes a diamond-like carbon film.

15. The method according to claim 1, wherein the second film includes an amorphous carbon film.

16. The method according to claim 1, wherein the second layer further includes hydrogen atom.

17. The method according to claim 1, wherein the second layer further includes free hydrogen.

18. The method according to claim 1, wherein the second layer further includes $1.5 \times 10^{22}$ atoms/cm$^3$ or more of free hydrogen.

19. A method of manufacturing a semiconductor device, the method comprising:
   forming a first film on a substrate;
   forming a first layer on the first film;
   forming a second layer on the first layer;
   forming a third layer on the second layer;
   forming a first recess in the first layer through the third layer; and
   forming a second recess in the first film using the first layer through the third layer that collectively have the first recess as a mask,
   wherein the second layer has a second carbon density lower than a first carbon density of the first layer, and
   the third layer has carbon with a third carbon density higher than the second carbon density.

* * * * *